(12) United States Patent  (10) Patent No.: US 7,880,205 B2
Han  (45) Date of Patent: Feb. 1, 2011

(54) IMAGE SENSOR AND METHOD FOR MANUFACTURING THE SAME

(75) Inventor: Chang Hun Han, Icheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 87 days.

(21) Appl. No.: 12/234,991

(22) Filed: Sep. 22, 2008

(65) Prior Publication Data

US 2009/0085080 A1  Apr. 2, 2009

(30) Foreign Application Priority Data

Sep. 28, 2007  (KR) .................. 10-2007-0097793

(51) Int. Cl.
  *H01L 27/108* (2006.01)
  *H01L 29/04* (2006.01)
  *H01L 31/062* (2006.01)
  *H01L 31/113* (2006.01)
  *H01L 31/036* (2006.01)

(52) U.S. Cl. .................. 257/292; 257/72; 257/290; 257/70

(58) Field of Classification Search .......... 257/292, 257/290, 72, 214, 215, 218, 291, 293, 294, 257/233, 431, 466
See application file for complete search history.

(56) References Cited

U.S. PATENT DOCUMENTS

| 6,252,218 | B1 | 6/2001 | Chou |
| 6,680,573 | B1 | 1/2004 | Kim et al. |
| 7,683,408 | B2 * | 3/2010 | Hong .................. 257/292 |
| 2005/0233493 | A1 * | 10/2005 | Augusto ................ 438/51 |
| 2009/0065831 | A1 * | 3/2009 | Lee .................... 257/292 |

FOREIGN PATENT DOCUMENTS

| JP | 2000-156488 | 6/2000 |
| KR | 10-2005-0042729 | 5/2005 |

* cited by examiner

*Primary Examiner*—Chuong A. Luu
(74) *Attorney, Agent, or Firm*—Saliwanchik Lloyd & Saliwanchik

(57) ABSTRACT

Disclosed is an image sensor. The image sensor includes a semiconductor substrate including unit pixels, an interlayer dielectric layer including metal interconnections formed on the semiconductor substrate, a plurality of bottom electrodes formed on the interlayer dielectric layer in correspondence with the unit pixels, the plurality of bottom electrodes includes bottom electrodes having at least two different sizes, a photodiode formed on the interlayer dielectric layer including the bottom electrodes, and color filters formed on the photodiode in correspondence with the unit pixels.

9 Claims, 8 Drawing Sheets

IMAGE SENSOR AND METHOD FOR MANUFACTURING THE SAME

CROSS REFERENCE TO RELATED APPLICATION

The present application claims the benefit under 35 U.S.C. §119 of Korean Patent Application No. 10-2007-0097793, filed Sep. 28, 2007, which is hereby incorporated by reference in its entirety.

BACKGROUND

Image sensors are semiconductor devices that convert optical images into electrical signals. Image sensors are mainly classified as a CCD (charge coupled device) image sensor or a CMOS (complementary metal oxide silicon) image sensor.

The CMOS image sensor includes a photodiode and a MOS transistor in each unit pixel, and sequentially detects the electric signals of each unit pixel in a switching mode to realize images.

The CMOS image sensor includes a photodiode region for converting light signals into electric signals and a transistor for processing the electric signals. Typically, the photodiode region and the transistor are horizontally aligned on a semiconductor substrate.

According to the horizontal CMOS image sensor, a photodiode and the transistor are horizontally aligned on the substrate such that they are adjacent to each other. Thus, an additional area of the substrate is required for each unit pixel to form the photodiode.

BRIEF SUMMARY

Embodiments of the present invention provide an image sensor and a method for manufacturing the same, capable of providing a vertical stack structure of a transistor circuit and a photodiode.

An image sensor according to an embodiment includes a semiconductor substrate including unit pixels; an interlayer dielectric layer including metal interconnections formed on the semiconductor substrate in correspondence with the unit pixels; a plurality of bottom electrodes formed on the interlayer dielectric layer in correspondence with the unit pixels, the plurality of bottom electrodes comprising bottom electrodes having at least two different sizes; a photodiode formed on the interlayer dielectric layer including the plurality of bottom electrodes; and color filters formed on the photodiode in correspondence with the unit pixels.

A method for manufacturing the image sensor according to an embodiment includes: forming an interlayer dielectric layer including metal interconnections corresponding to unit pixels on a semiconductor substrate; forming a plurality of bottom electrodes on the interlayer dielectric layer corresponding to respective unit pixels, the plurality of bottom electrodes comprising bottom electrodes having sizes different from each other; forming a photodiode on the interlayer dielectric layer including the plurality of bottom electrodes; and forming color filters on the photodiode in correspondence with the unit pixels.

DETAILED DESCRIPTION

Hereinafter, embodiments of an image sensor and a method for manufacturing the same will be described with reference to accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

It is to be understood that the figures and descriptions of embodiments of the present invention have been simplified to illustrate elements that are relevant for a clear understanding of the invention, while eliminating, for purposes of clarity, other elements that may be well known. Those of ordinary skill in the art will recognize that other elements may be desirable and/or required in order to implement the present invention. However, because such elements are well known in the art, and because they do not facilitate a better understanding of the present invention, a discussion of such elements is not provided herein.

Figure 6:
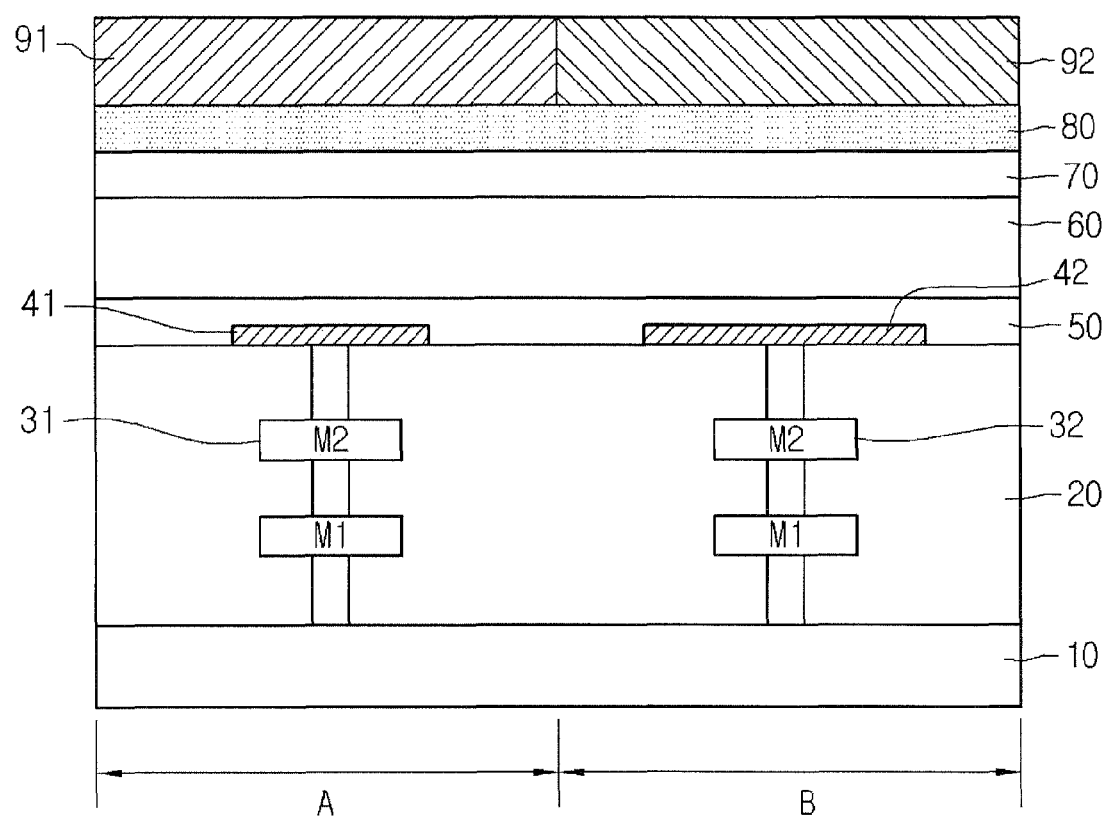

FIG. 6 is a cross-sectional view showing an image sensor according to an embodiment.

Referring to FIG. 6, an interlayer dielectric layer 20 including first and second metal interconnections 31 and 32 can be formed on a semiconductor substrate 10 including first and second pixels A and B. The first metal interconnection 31 can be provided in the first pixel A and the second metal interconnection 32 can be provided in the second pixel B.

A CMOS circuit (not shown), which is connected to a photodiode to convert optical charges into electric signals, is provided in each of the first and second pixels A and B formed on the semiconductor substrate 20.

The interlayer dielectric layer 20 can have a multi-layer structure. According to embodiments, the first and second metal interconnections 31 and 32 can be interposed in the multi-layer structure such that the first and second metal interconnections 31 and 32 can be connected to the first and second pixels A and B, respectively. In addition, the first and second metal interconnections 31 and 32 can be formed using multiple metal layers.

Figure 9:
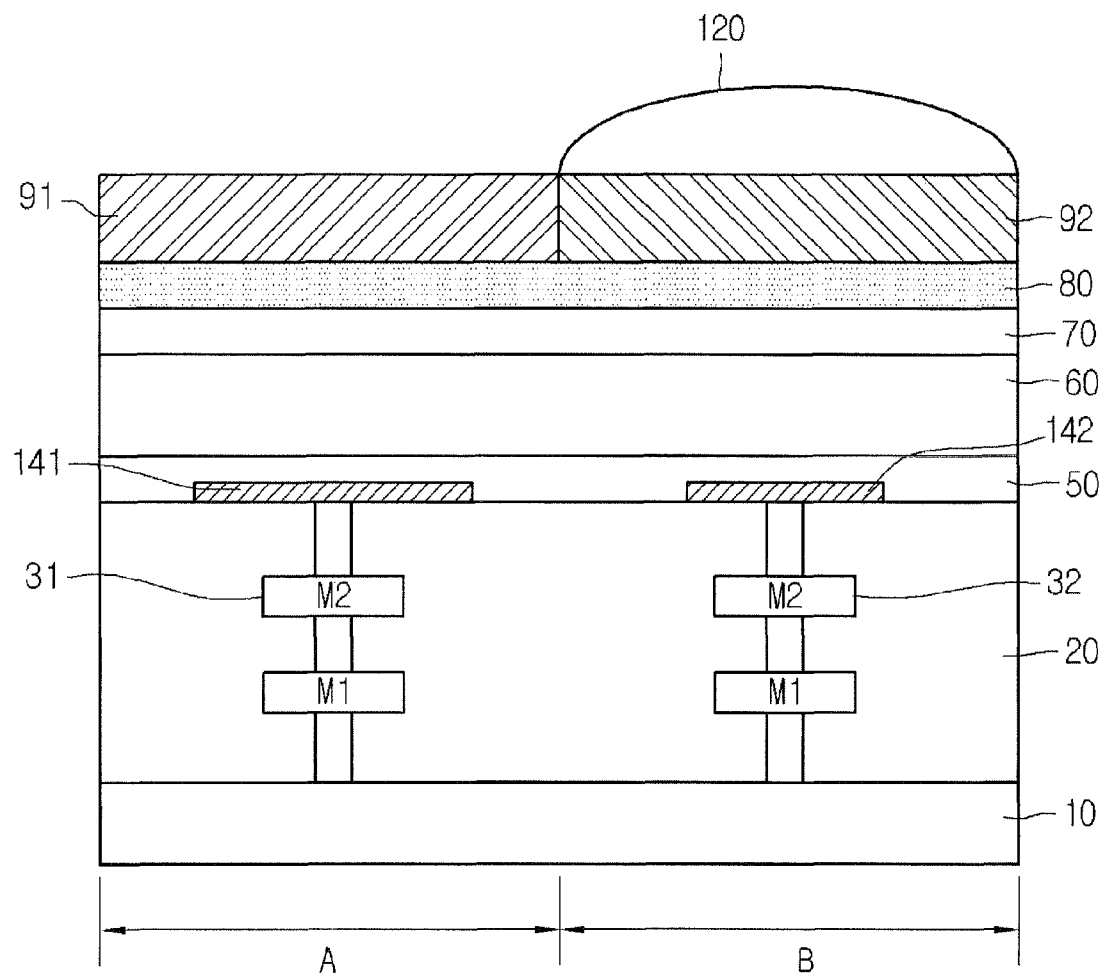
FIG. 9 is a cross-sectional view of an image sensor according to another embodiment.

First and second bottom electrodes 41 and 42 having different sizes can be formed on the interlayer dielectric layer 20 such that the first bottom electrode 41 connects to the first metal interconnection 31 and the second bottom electrode 42 connects to the second metal interconnection 32. In an embodiment, the first bottom electrode 41 can have a size smaller than that of the second bottom electrode 42. In another embodiment, as shown in FIG. 9, the second bottom electrode 42 can have a size smaller than that of the first bottom electrode 41.

The photodiode can be provided on the interlayer dielectric layer 20 including the first and second bottom electrodes 41 and 42. The photodiode can include a first conductive layer 50, an intrinsic layer 60, and a second conductive layer 70. In one embodiment, the first conductive layer 50 includes an N-type silicon layer, the intrinsic layer 60 includes an amorphous silicon layer, and the second conductive layer 70 includes a P-type silicon layer.

By forming the sizes of the first and second bottom electrodes 41 and 42 different from each other, a distance between the first and second bottom electrodes 41 and 42 can be lengthened. Thus, the photo charges generated from the photodiode can be inhibited from being transferred to an adjacent pixel, so that crosstalk of the image sensor can be reduced.

A top electrode 80 can be disposed on the photodiode. The top electrode 80 can be a transparent electrode formed, for example, of ITO (indium tin oxide), CTO (cadmium tin oxide), or $ZnO_2$ (zinc oxide).

First and second color filters 91 and 92 can be provided on the top electrode 80 corresponding to the first and second pixels A and B. The first color filter 91 can be a green color filter and the second color filter 92 can be a red color filter or a blue color filter. Thus, the green color filter is formed on the first pixel A and the red or blue color filter is formed on the second pixel B.

Figure 8:
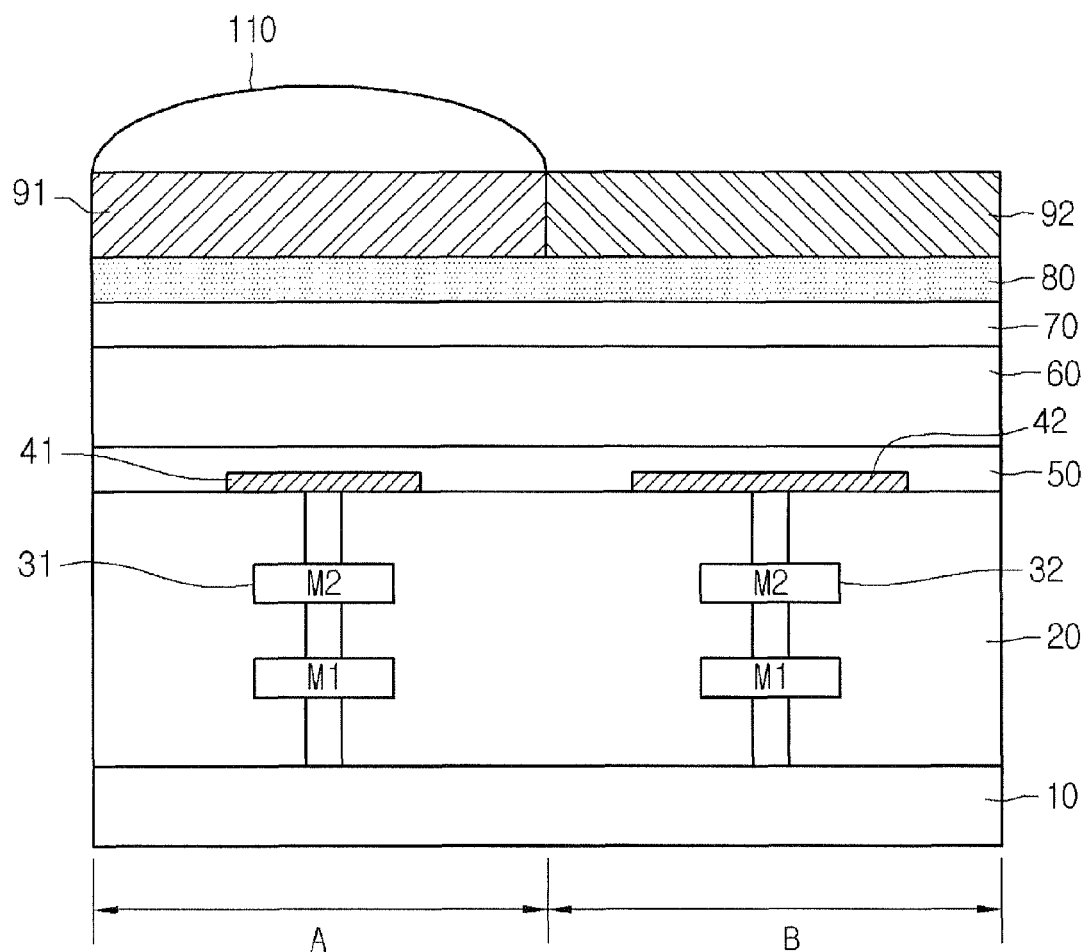
FIG. 8 is a cross-sectional view of an image sensor including a micro-lens according to an embodiment.

Referring to FIG. 8, a micro-lens 110 can be formed on the first color filter 91. In an alternate embodiment such as shown in FIG. 9, the micro-lens 120 can be formed on the second color filter 92.

That is, the micro-lens can be formed on the color filter provided on the bottom electrode having the smaller size (e.g., bottom electrode 41 and 142). Thus, the light focusing rate of the photodiode corresponding to the bottom electrode having the smaller size can be improved, so that optical characteristics of the image sensor can be improved.

Hereinafter, a method for manufacturing an image sensor according to an embodiment will be described with reference to FIGS. 1 to 8.

Figure 1:
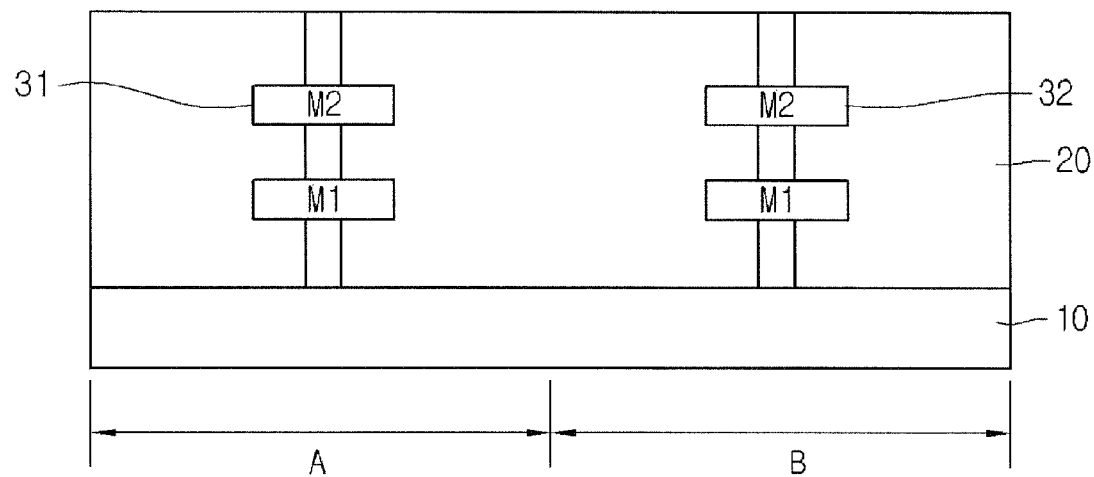
FIGS. 1 to 6 are cross-sectional views showing a method for manufacturing an image sensor according to an embodiment.

Referring to FIG. 1, an interlayer dielectric layer 20 including the first and second metal interconnections 31 and 32 can be formed on the semiconductor substrate 10 including the first and second pixels A and B.

A CMOS circuit (not shown), which is connected to the photodiode to convert optical charges into electric signals, is provided in the first and second pixels A and B formed on the semiconductor substrate 20. In certain embodiments, the CMOS circuit can be a 3Tr-, 4Tr-, or 5Tr-type circuit.

Additional metal interconnections can be formed in the interlayer dielectric layer 20 to provide electric connection to a power line or a signal line.

The interlayer dielectric layer 20 can have a multi-layer structure. For instance, the interlayer dielectric layer 20 can include one or more nitride layers and/or one or more oxide layers.

In addition, the first and second metal interconnections 31 and 32 can have multi-layer structures. The first metal interconnection 31 can be connected to the first pixel A and the second metal connection 32 can be connected to the second pixel B. The first and second metal interconnections 31 and 32 transfer the electrons generated from the photodiode to the CMOS circuit aligned below the photodiode according to unit pixel. Although not shown in the figures, the first and second metal interconnections 31 and 32 can be connected to an impurity region formed at a lower portion of the semiconductor substrate 10.

A plurality of first and second metal interconnections 31 and 32 can be formed through the interlayer dielectric layer 20. The first and second metal interconnections 31 and 32 can be formed of any suitable materials known in the art, and can include a metal, an alloy or a conductive material including silicide. In an embodiment, the first and second metal interconnections 31 and 32 can include, for example, aluminum, copper, cobalt, or tungsten.

Figure 2:
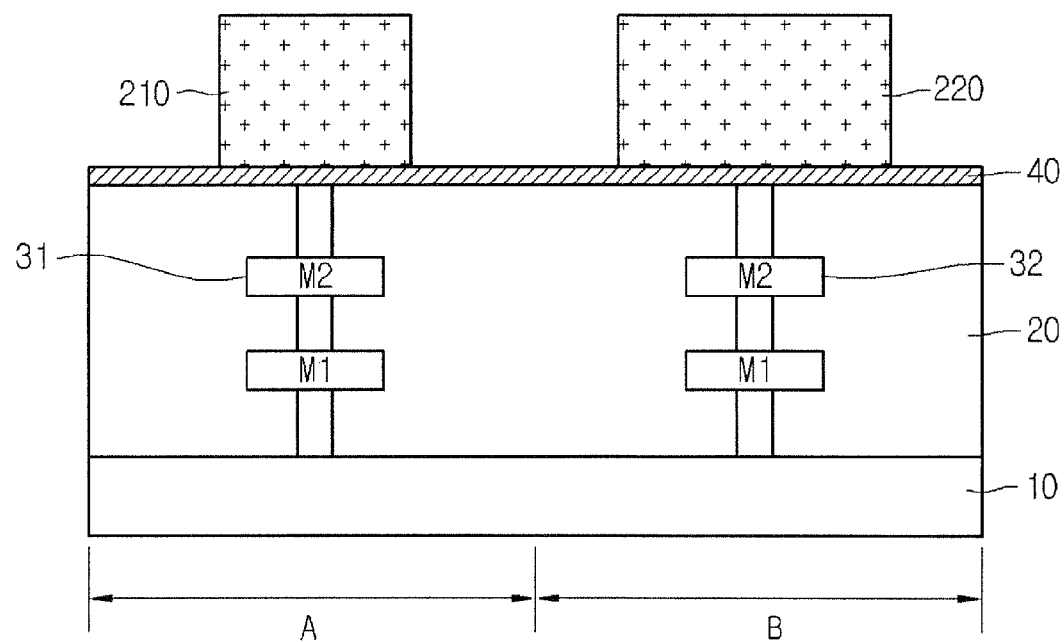

Referring to FIG. 2, a bottom electrode layer 40 can be formed on the interlayer dielectric layer 20. The bottom electrode layer 40 can be electrically connected to the first and second metal interconnections 31 and 32. The bottom electrode layer 40 can include a metal, such as chrome (Cr), titanium (Ti), titanium-tungsten alloy (TiW), or tantalum (Ta).

First and second photoresist patterns 210 and 220 can be formed on the bottom electrode layer 40 to pattern the bottom electrode layer 40 in correspondence with each pixel. The first and second photoresist patterns 210 and 220 cover the bottom electrode layer 40 on regions corresponding to the first and second metal interconnections 31 and 32.

The first and second photoresist patterns 210 and 220 can have sizes different from each other. For instance, the first photoresist pattern 210 can have a size smaller than that of the second photoresist pattern 220. Alternatively, the first photoresist pattern 210 can have a size larger than that of the second photodiode pattern 220.

The bottom electrode layer 40 can be etched by using the first and second photoresist patterns 210 and 220 as an etch mask to form first and second electrodes 41 and 42.

Figure 3:
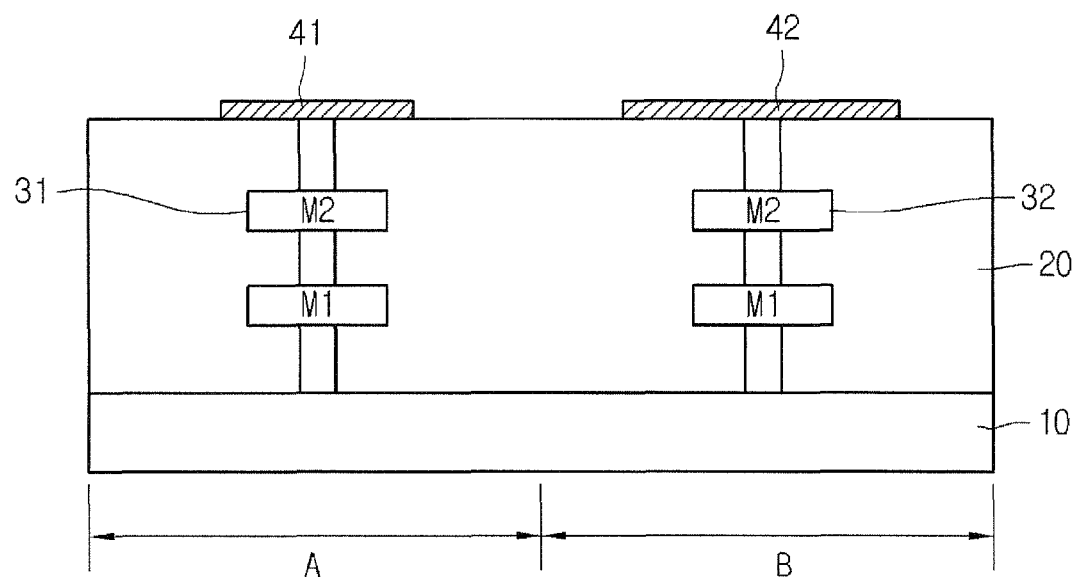

Referring to FIG. 3, the first and second bottom electrodes 41 and 42 can be formed on the interlayer dielectric layer 20 in correspondence with each pixel. The first bottom electrode 41 can be connected to the first metal interconnection 31 and the second bottom electrode 42 can be connected to the second metal interconnection 32. According to an embodiment, the first bottom electrode 41 can have the size smaller than the size of the second bottom electrode 42. For instance, the size of the first bottom electrode 41 can be smaller than the size of the second bottom electrode 42 by about 10% to 75% such that the first bottom electrode 41 is about 25% to 90% the size of the second bottom electrode 42.

By forming the first bottom electrode 41 smaller than the second bottom electrode 42, the crosstalk of incident light onto the photodiode can be reduced.

Figure 4:
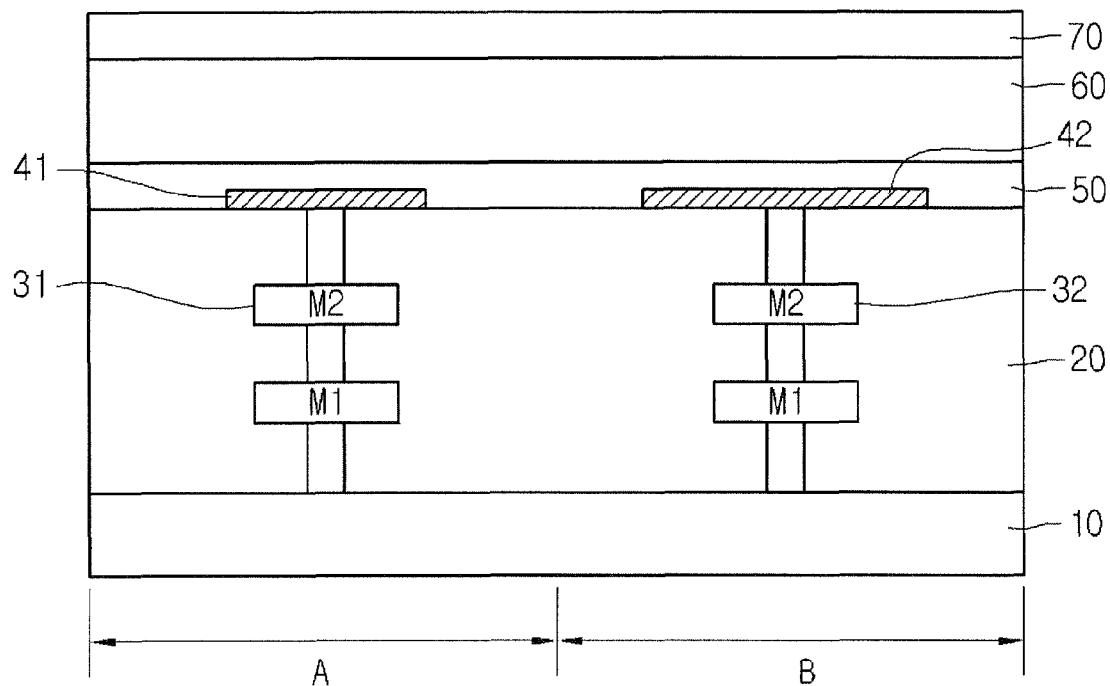

Referring to FIG. 4, a photodiode can be formed on the interlayer dielectric layer 20 including the first and second bottom electrodes 41 and 42.

According to one embodiment, the photodiode can be an NIP diode. The NIP diode can have a bonding structure of an n-type amorphous silicon layer, an intrinsic amorphous silicon layer and a p-type amorphous silicon layer.

The NIP diode refers to the photodiode in which the intrinsic amorphous silicon layer, which is a pure semiconductor layer, is provided between the p-type silicon layer and the metal or the n-type silicon layer. The intrinsic amorphous silicon layer interposed between the p-type silicon layer and the metal or n-type silicon layer can serve as a depletion region so that electric charges are easily generated and stored.

According to certain embodiments, the photodiode can have a P-I-N structure, N-I-P structure, or I-P structure. The photodiode having the N-I-P structure is employed in the embodiment described below. Accordingly, in the following description, the first conductive layer 50 can be an n-type amorphous silicon layer, the intrinsic layer 60 can be an intrinsic amorphous silicon layer, and the second conductive layer can be a p-type amorphous silicon layer. Of course, embodiments are not limited thereto.

Hereinafter, a method for forming the photodiode will be described.

According to an embodiment, a first conductive layer 50 can be formed on the interlayer dielectric layer 20. In certain embodiments, the first conductive layer 50 can be omitted and the subsequent processes can be performed without forming the first conductive layer 50.

The first conductive layer 50 can serve as an N-layer of the N-I-P diode. That is, the first conductive layer 50 is an N-type conductive layer. However, embodiments are not limited thereto.

An intrinsic layer 60 can be formed on the first conductive layer 50. The intrinsic layer 60 can serve as an I-layer of the N-I-P diode in the embodiment. The intrinsic layer 60 can be formed by using intrinsic amorphous silicon.

The intrinsic layer 60 can have a thickness thicker than that of the first conductive layer by 10 to 1000 times. By using a thick intrinsic layer 60, the depletion region of the pin diode can be enlarged so that a greater amount of photo charges can be easily generated and stored.

A second conductive layer 70 can be formed on the intrinsic layer 60. In one embodiment, the second conductive layer 70 can be formed simultaneously with the intrinsic layer 60. The second conductive layer 60 can serve as a P-layer of the N-I-P diode in the embodiment. That is, the second conductive layer 70 is a P-type conductive layer, but embodiments are not limited thereto.

Accordingly, the first and second pixels A and B and the photodiode can be vertically stacked on the semiconductor substrate 10, so that the fill factor of the photodiode can reach approximately 100%.

Figure 5:
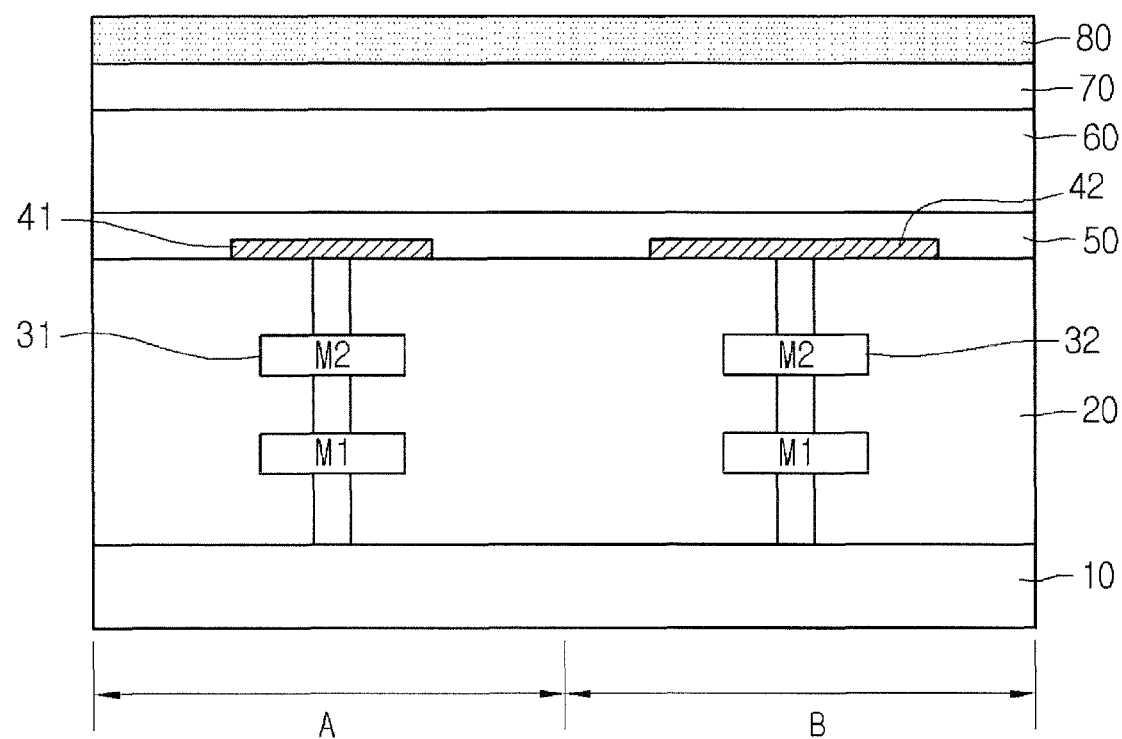

Referring to FIG. 5, a top electrode 80 can be formed on the semiconductor substrate 10 including the photodiode.

The top electrode 80 can be a transparent electrode having superior light transmittance and conductivity. For instance, the top electrode 80 can be formed of ITO (indium tin oxide), CTO (cadmium tin oxide), or $ZnO_2$ (zinc oxide).

Referring to FIG. 6, color filters can be formed on the top electrode 80. The color filters can be formed on each pixel by using dyeable photoresist to filter colors from the incident light.

A first color filter 91 can be formed on the first pixel A and a second color filter 92 can be formed on the second pixel B. According to an embodiment, the first color filter 91 is a green color filter, and the second color filter 92 is a red color filter. In addition, although not shown in the drawings, a third color filter can be formed on a third pixel, and can be a blue color filter. In addition, the third pixel can be provided with a larger sized bottom electrode (similar to the second pixel B).

Accordingly, light that has passed through the first color filter 91 is transferred as electric charges to the first pixel A through the first bottom electrode 41 and the first metal interconnection 31. In addition, light that has passed through the second color filter 92 is transferred as electric charges to the second pixel B through the photodiode, the second bottom electrode 42 and the second metal interconnection 32. The first and second bottom electrodes 41 and 42 have different sizes and are spaced apart from each other by a predetermined distance, so the photo electrons generated from the photodiode can be transferred to the first and second bottom electrodes 41 and 42. That is, since the size of the first bottom electrode 41 is smaller than the size of the second bottom electrode 42, the interval between the first and second bottom electrodes 41 and 42 is enlarged, so that the photodiode can be divided in correspondence with each pixel. Thus, the photo electrons generated from the photodiode can be inhibited from being transferred to an adjacent bottom electrode, reducing crosstalk.

Figure 7:
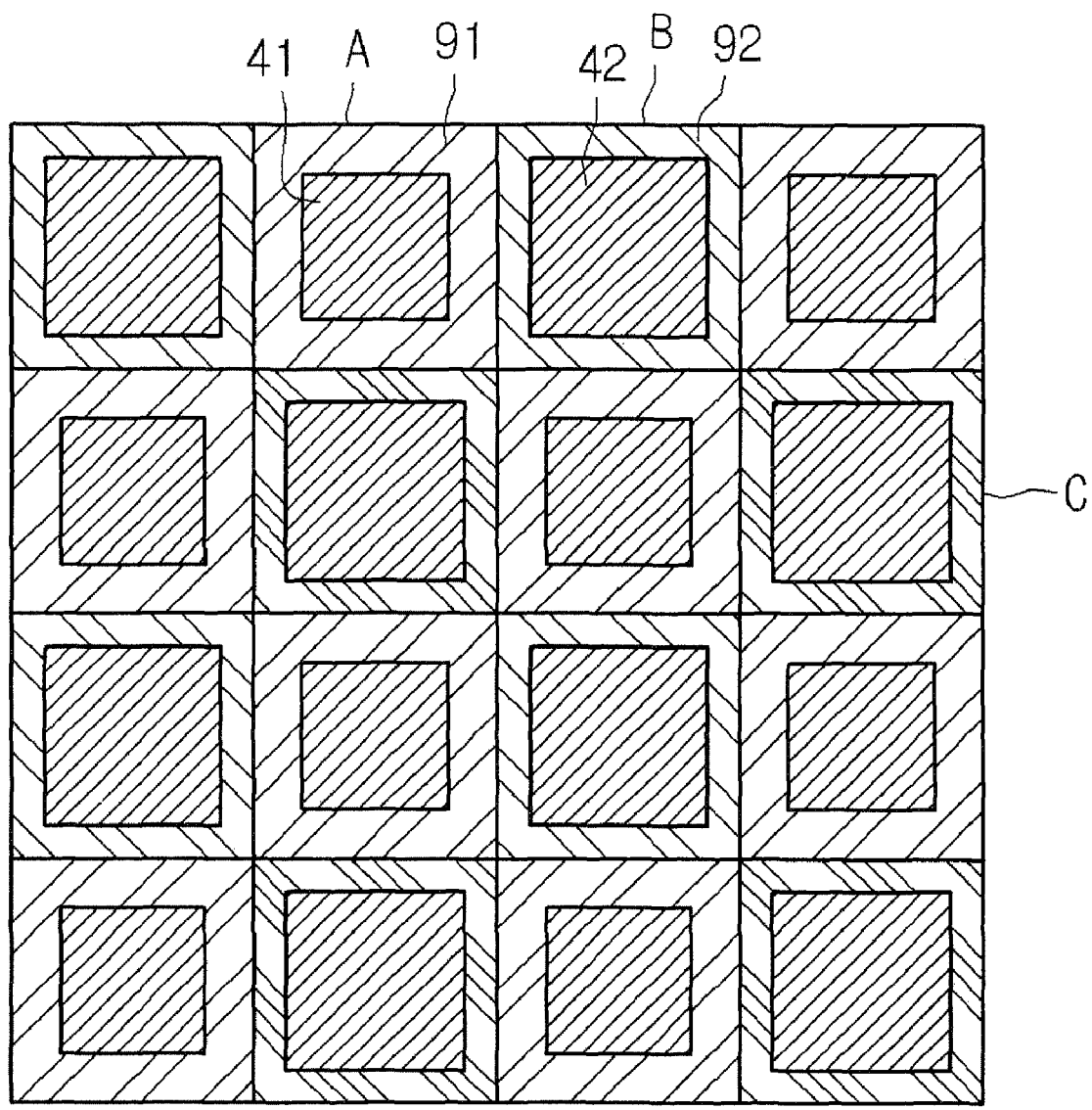
FIG. 7 is a plan view of an image sensor according to an embodiment.

FIG. 7 is a plan view showing areas of the first and second bottom electrodes 41 and 42 and the first and second color filters 91 and 92 formed on the first and second pixels A and B.

As shown in FIG. 7, the first bottom electrode 41 formed on the first pixel A has the size smaller than the size of the second bottom electrode 42 formed on the second pixel B. A plurality of first type pixels and second type pixels can be provided. In one embodiment, the pixels can have a checkerboard appearance with alternating smaller sized and larger sized bottom electrodes. Accordingly, the bottom electrode 41 formed on the first pixel A can have the size smaller than a size of a third bottom electrode formed on a third pixel C. In addition, the third pixel C can be a second type pixel (similar to second pixel B).

Referring to FIG. 8, a micro-lens 110 can be formed on the first color filter 91. The micro-lens 110 can be exclusively formed on the first color filter 91 (and other color filters corresponding to the smaller sized bottom electrodes) in order to focus the incident light onto the photodiode such that the incident light can be transferred to the bottom electrode 41.

Since the size of the first bottom electrode 41 is relatively smaller than the size of the second bottom electrode 42, the amount of the photo electrons transferred to the first bottom electrode 41 is smaller than the amount of the photo electrons transferred to the second bottom electrode 42. In this regard, the micro-lens 110 is formed on the first color filter 91. If the micro-lens 110 is formed on the first color filter 91, a greater amount of light can be incident into the photodiode region corresponding to the first bottom electrode 41, so that the amount of light directed to the first bottom electrode 41 can be increased.

Figure 10:
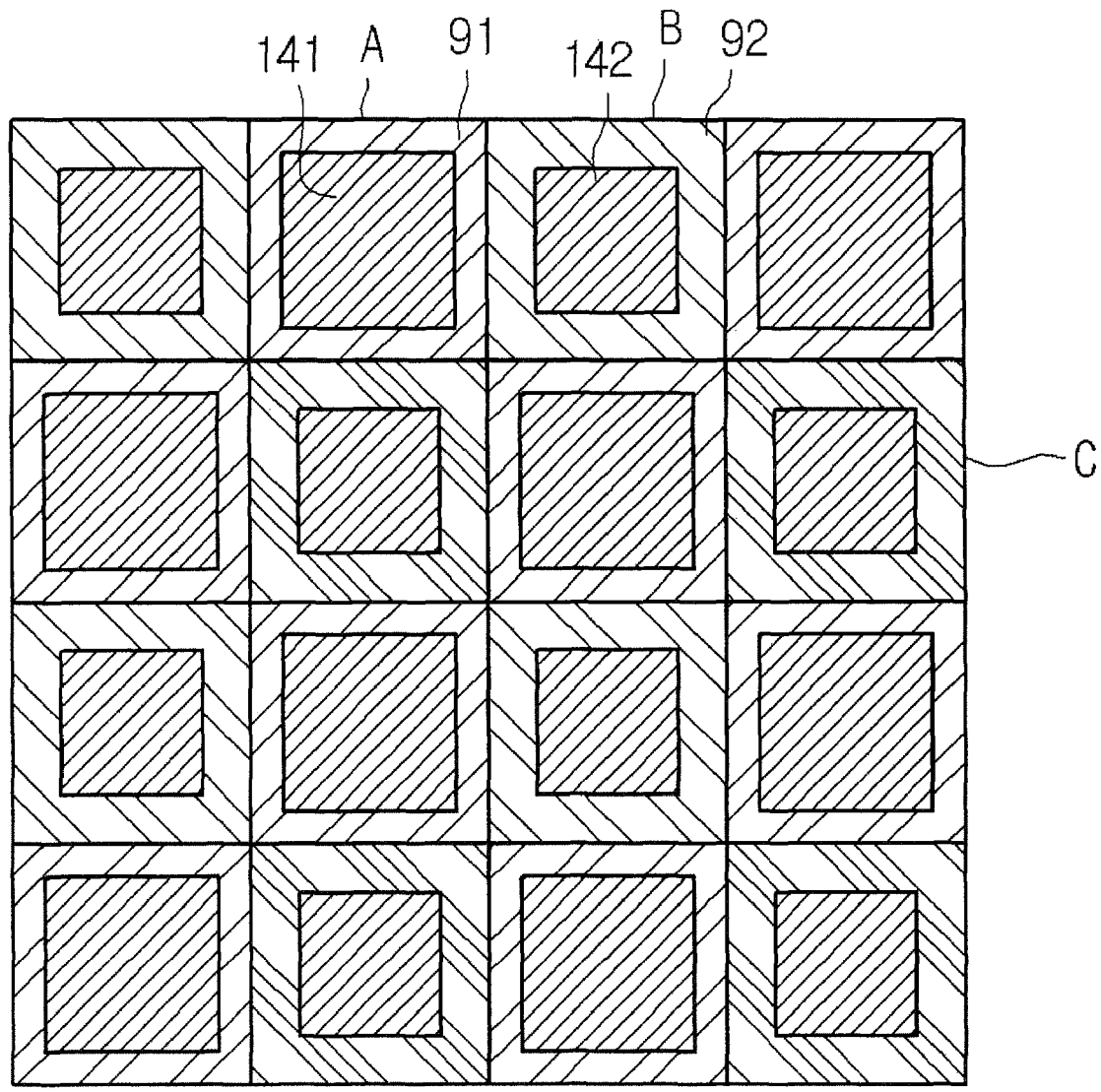
FIG. 10 is a plan view of an image sensor according to an embodiment as shown in FIG. 9.

FIGS. 9 and 10 are a cross-sectional view and a plan view of an image sensor according to another embodiment.

Referring to FIGS. 9 and 10, a first bottom electrode 141 formed on the first pixel A has a size larger than that of a second bottom electrode 142 formed on the second pixel B. In addition, the size of the first bottom electrode 141 formed on the first pixel A can be larger than the size of the bottom electrode formed on the third pixel C. Since the size of the first bottom electrode 141 is relatively larger than the size of the second bottom electrode 142, a larger gap can be formed between the first and second bottom electrodes 141 and 142 as compared to a case where the electrodes were both large sized. According to the embodiment illustrated in FIGS. 9 and 10, the first pixel A can have the green color filter formed thereon and the second pixel B and the third pixel C can have the red and blue color filters formed thereon.

Since the first bottom electrode 141 is spaced apart from the second bottom electrode 142 by a predetermined distance, the photodiode can be divided in correspondence with each pixel. Thus, the photo electrons generated from the photodiode can be transferred to the corresponding bottom electrode for a particular area, and crosstalk can be reduced.

In addition, a micro-lens 120 can be formed on the second color filter 92. In this case, the light focusing rate of the photodiode corresponding to the second bottom electrode 142 can be improved, so that the amount of light transferred to the second bottom electrode 142 may be relatively increased.

According to embodiments, the first and second bottom electrodes, which transfer the photo electrons of the photodiode to a circuit aligned below the photodiode, can be formed to have sizes different from each other, enlarging the interval between the first and second bottom electrodes while reducing crosstalk.

In addition, a micro-lens can be formed on the bottom electrode having a smaller size, so that image characteristics of the image sensor can be improved.

According to embodiments of the image sensor and the method for manufacturing the same, the transistor circuitry and the photodiode can be vertically stacked.

In addition, the fill factor can approach approximately 100% due to the vertical stack structure of the transistor circuitry and the photodiode.

Further, higher sensitivity can be obtained as compared with that of the related art due to the vertical stack structure.

In addition, when comparing with the related art, embodiments of the present invention can reduce the process cost for the same resolution.

Further, in certain embodiments, each pixel can be formed with additional or complicated circuitry without reducing the sensitivity thereof.

In a further embodiment, additional on-chip circuitry can be provided, so that performance of the image sensor can be improved, the device can be minimized and the manufacturing cost can be reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   an interlayer dielectric layer including metal interconnections on a semiconductor substrate, wherein the metal interconnections are arranged according to unit pixels;
   a plurality of bottom electrodes on the interlayer dielectric layer in correspondence with the unit pixels, wherein the plurality of bottom electrodes comprises bottom electrodes having sizes different from each other;
   a photodiode on the interlayer dielectric layer including the bottom electrodes; and
   color filters on the photodiode arranged according to the unit pixels.

2. The image sensor according to claim 1, wherein at least one of the bottom electrodes has a size smaller than a size of other bottom electrodes of the plurality of bottom electrodes.

3. The image sensor according to claim 2, wherein the color filter aligned on the at least one bottom electrode having the smaller size is a green color filter.

4. The image sensor according to claim 2, wherein the color filter aligned on the at least one bottom electrode having the smaller size is a red color filter.

5. The image sensor according to claim 2, wherein the color filter aligned on the at least one bottom electrode having the smaller size is a blue color filter.

6. The image sensor according to claim 2, further comprising a micro-lens disposed only on each color filter corresponding to the at least one bottom electrode having the smaller size.

7. The image sensor according to claim 1, wherein the plurality of bottom electrodes are arranged in a checkerboard pattern of smaller sized and larger sized bottom electrodes.

8. The image sensor according to claim 7, wherein the color filters comprise green color filters, red color filters, and blue color filters, wherein the green color filters are aligned on the smaller sized bottom electrodes, and the red color filters and blue color filters are aligned on the larger sized bottom electrodes.

9. The image sensor according to claim 7, wherein the color filters comprise green color filters, red color filters, and blue color filters, wherein the green color filters are aligned on the larger sized bottom electrodes, and the red color filters and blue color filters are aligned on the smaller sized bottom electrodes.

* * * * *